(12) United States Patent
Asbeck et al.

(10) Patent No.: US 10,050,581 B2
(45) Date of Patent: Aug. 14, 2018

(54) FRAME PROFILE MOULDING FOR SOLAR CELL LAMINATE, FRAMED SOLAR MODULE AND FASTENING SYSTEM FOR SOLAR MODULES

(71) Applicant: SOLARWORLD INDUSTRIES GMBH, Bonn (DE)

(72) Inventors: Frank Asbeck, Bonn (DE); Markus Hund, Euskirchen (DE)

(73) Assignee: SOLARWORLD INDUSTRIES GMBH, Bonn (DE)

( * ) Notice: Subject to any disclaimer, the term of this patent is extended or adjusted under 35 U.S.C. 154(b) by 0 days.

(21) Appl. No.: 15/082,318

(22) Filed: Mar. 28, 2016

(65) Prior Publication Data

US 2016/0285414 A1 Sep. 29, 2016

(30) Foreign Application Priority Data

Mar. 26, 2015 (DE) .................... 20 2015 002 312 U

(51) Int. Cl.
*H01L 31/044* (2014.01)
*H02S 30/10* (2014.01)
(Continued)

(52) U.S. Cl.
CPC ............. *H02S 30/10* (2014.12); *F24J 2/5203* (2013.01); *F24J 2/5207* (2013.01); *F24J 2/5211* (2013.01);
(Continued)

(58) Field of Classification Search
CPC ....... H01L 31/00–31/078; Y02E 10/50–10/60; H02S 10/00–10/40;
(Continued)

(56) References Cited

U.S. PATENT DOCUMENTS

2010/0237029 A1* 9/2010 Cusson .................... F24J 2/465
211/41.1
2011/0068244 A1* 3/2011 Hartelius ............... F24J 2/5232
248/298.1
(Continued)

FOREIGN PATENT DOCUMENTS

CN 102347386 A 2/2012
CN 202839680 U 3/2013
(Continued)

OTHER PUBLICATIONS

English Translation for JP2000114570.*

*Primary Examiner* — Bach T Dinh
(74) *Attorney, Agent, or Firm* — Oliff PLC

(57) ABSTRACT

A frame profile (1) for a solar cell laminate (10) includes a laminate clamping section (2), which comprises two parallel clamping feet (2a, 2b) configured plane and mutually spaced apart for clamped mounting of the solar cell laminate (10); and a profile section (3) adjoining the laminate clamping section (2), which includes a portion formed—by sides (3a, 3b)—for the solar cell laminate (10). Therefore, the sides (3a, 3b) are formed such that the portion includes an undercut at least partially. A solar module (100) with at least one such frame profile (1) has a panel-shaped solar cell laminate (10), which is inserted between the clamping feet (2a, 2b) of the laminate clamping section (2) right up to the portion and is connected to the frame profile (1) of an at least partially framed solar module (100).

14 Claims, 2 Drawing Sheets

(51) Int. Cl.
  *H02S 20/00* (2014.01)
  *H02S 20/23* (2014.01)
  *F24J 2/52* (2006.01)
  *H01L 31/0203* (2014.01)
(52) U.S. Cl.
  CPC ............ *F24J 2/5245* (2013.01); *F24J 2/5262* (2013.01); *H02S 20/00* (2013.01); *H02S 20/23* (2014.12); *H01L 31/0203* (2013.01); *Y02B 10/12* (2013.01); *Y02E 10/47* (2013.01); *Y02E 10/50* (2013.01)
(58) Field of Classification Search
  CPC ......... H02S 20/00–20/32; H02S 30/00–30/20; H02S 40/00–40/40; H02S 50/00–50/15
  USPC .................................................. 136/243–265
  See application file for complete search history.

(56) References Cited

U.S. PATENT DOCUMENTS

| | | | | |
|---|---|---|---|---|
| 2011/0272368 A1* | 11/2011 | Kufner | ................... | F24J 2/5207 211/41.1 |
| 2012/0227791 A1* | 9/2012 | Vari | ........................ | H02S 20/23 136/251 |
| 2013/0284239 A1* | 10/2013 | Mun | ........................ | H01L 31/02 136/251 |
| 2014/0083504 A1* | 3/2014 | Kuo | ........................ | H01L 31/042 136/259 |

FOREIGN PATENT DOCUMENTS

| | | |
|---|---|---|
| CN | 103151405 A | 6/2013 |
| CN | 205160453 U | 4/2016 |
| DE | 10 2010 005 570 A1 | 7/2011 |
| EP | 2 253 902 A2 | 11/2010 |
| EP | 2811535 A1 | 12/2014 |
| JP | S6169854 U | 5/1986 |
| JP | S61127652 U | 8/1986 |
| JP | S63178354 U | 11/1988 |
| JP | H0514527 Y2 | 4/1993 |
| JP | H1113224 A | 1/1999 |
| JP | 2000114570 A | 4/2000 |
| JP | 2000-174311 A | 6/2000 |
| JP | 2005347395 A | 12/2005 |
| JP | 2006100639 A | 4/2006 |
| JP | 2006286898 A | 10/2006 |
| KR | 100983456 B1 | 9/2010 |
| KR | 20130051850 A | 5/2013 |

* cited by examiner

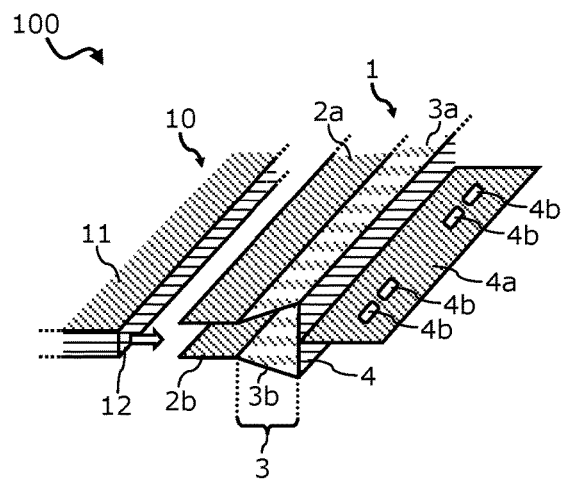
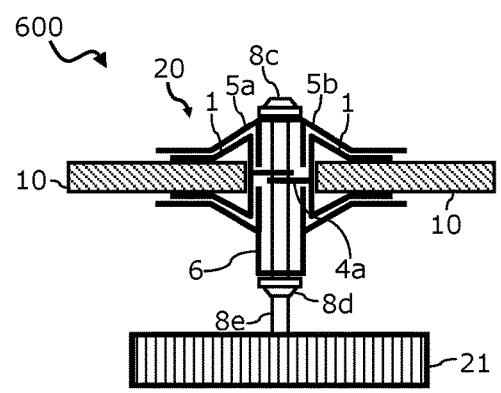
Fig. 7    Fig. 8
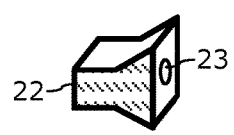
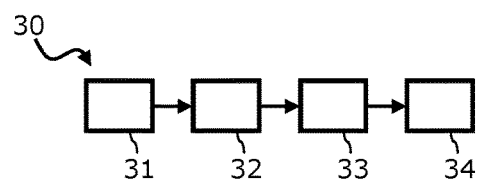
Fig. 9    Fig. 10
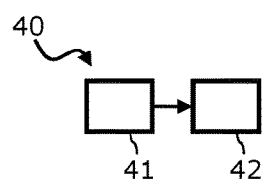
Fig. 11

FRAME PROFILE MOULDING FOR SOLAR CELL LAMINATE, FRAMED SOLAR MODULE AND FASTENING SYSTEM FOR SOLAR MODULES

TECHNICAL FIELD OF THE INVENTION

The invention relates to a frame profile for solar cell laminates, a solar module with such a frame profile, a fastening system for solar modules, a process for framing a solar cell laminate and a process for fastening a framed solar module to a support rail.

TECHNICAL BACKGROUND

Solar modules (often mentioned as photovoltaic modules or PV-modules) convert sunlight directly into electrical energy by photoelectric or photochemical process. For this purpose, solar modules have serially or parallel connected solar cells based on semiconductor material, which are disposed plane in a solar cell array. Rigid solar modules can consist of, for example, silicon-based solar cells, which are subjected to a lamination process for protection from adverse operating conditions, such as moisture, corrosion or mechanical loads.

Solar cell laminates are panel-shaped elements built in layers, which are used for encapsulation of the solar cells. For this purpose, the solar cell arrays can be embedded, for example, between a plastic material based ethylene vinyl acetate layer (EVA-layer) and a rear-side sealing layer of Silicon rubber or Tedlar. In addition or alternatively to this, a glass plate can also be laminated on the laminate.

For protecting the edges of such solar cell laminates from cascading ingress of liquids and for increasing the mechanical stability, the solar cell laminates are mostly framed into finished solar modules, for example—by means of extruded Aluminum profiles. These frames can also be used for fastening the solar modules on support rails or roof cross-beams.

The publication EP 2 253 902 A2 describes, for example—a component kit, which contains cross-traverses for supported mounting of rectangular solar modules and holder for attaching the cross-traverses to the cross-beams. As another example, the publication DE 10 2010 005 570 A1 discloses a profile element for fastening of solar cells, which have a support area facing the solar cell and a bonding area adjoining this.

SUMMARY OF THE INVENTION

One of the objects of the invention is now to find improved solutions for frames of solar cell laminates, which can withstand high surface loadings, are easy and quick to mount as well as simple to transport.

This and other objects are accomplished by a frame profile for a solar cell laminate, a solar module, a fastening system, a process for framing a solar cell laminate and a process for fastening a framed solar module on a support rail.

According to a first aspect of the invention, a frame profile for a solar cell laminate includes a laminate clamping section, which has two parallel clamping feet, configured plane and mutually spaced apart for clamped mounting of the solar cell laminate, and a profile section adjoining the laminate clamping section, which has a portion—formed by sides—for the solar cell laminate. Therefore, the sides are formed such that the portion has an undercut at least partially.

According to a second aspect of the invention, a solar module includes a panel-shaped solar cell laminate, and at least one frame profile, which has a laminate clamping section with two parallel clamping feet, configured plane and mutually spaced apart as well as a profile section adjoining the laminate clamping section, which has a portion formed by sides. Therefore, the sides are formed such that the portion has one undercut at least partially. The solar cell laminate is introduced between the clamping feet of the laminate clamping section right up to the portion and with the frame profile connected to at least partially framed solar module.

According to a third aspect of the invention, the fastening system includes at least one solar module according to the second aspect of the invention, and at least one support rail, which has at least one mounting rail, which is in form-fit engagement with the frame profile of the solar module.

According to a fourth aspect of the invention, a process for framing of a solar cell laminate includes the steps of inserting a panel-shaped solar cell laminate into a laminate clamping section of a frame profile with two parallel clamping feet, configured plane and mutually spaced apart, and making the panel-shaped solar cell laminate through the laminate clamping section into a profile section adjoining the laminate clamping section, which has a portion formed by the sides, wherein the sides are formed such that the portion has an undercut at least partially, and fixing the solar cell laminate between the clamping feet.

According to a fifth aspect of the invention, a process for fastening a framed solar module to a support rail includes the step of inserting the frame profile of the solar module into a mounting rail of the support rail, so that the frame profile of the solar module is in form-fit engagement with the mounting rail, and attaching a rail end cap to the open end of the mounting rail of the support rail, which arrests the solar module in the mounting rail.

An essential concept of the invention is to make the frame of a solar cell laminate by a hollow profile with undercut, so that the frame serves not only to protect and border the solar cell laminate, but simultaneously represents a tapping element of a tongue-and-groove joint with a support rail. Thereby, a support rail of a fastening system can be provided with a hollow profile, which corresponds to the outer shape of the frame of the solar cell laminate. A solar module, which has one such framed solar cell laminate, can then be brought in form-fit engagement with the hollow profile of the support rail to safely arrest the solar module.

Advantageous configurations and improvements result from the further subordinate claims and from the description with reference to the figures.

The above configurations and improvements can be combined in any combination, where appropriate. Further possible configurations, improvements and implementations of the invention also include the combinations of features of the invention mentioned above or described in the following with reference to the exemplary embodiments. In particular, therefore, the skilled person will also add individual aspects as improvements or additions to the respective basic form of the present invention.

BRIEF SUMMARY OF THE FIGURES

The present invention is explained in more details below by means of the exemplary embodiments specified in the schematic figures. Therefore, they show:

FIG. 7 shows a schematic illustration of another frame profile for a solar cell laminate according to another exemplary embodiment of the invention;

FIG. 8 shows a schematic illustration of exemplary detail of a fastening system for solar modules according to another exemplary embodiment of the invention;

FIG. 9 shows a schematic illustration of a rail end-cap for the fastening systems of FIGS. 3 and 4 according to another exemplary embodiment of the invention;

FIG. 10 shows a block diagram of a process for framing a solar cell laminate according to another exemplary embodiment of the invention; and FIG. 11 shows a block diagram of a process for fastening a framed solar module on a support rail according to another exemplary embodiment of the invention.

Figure 1:
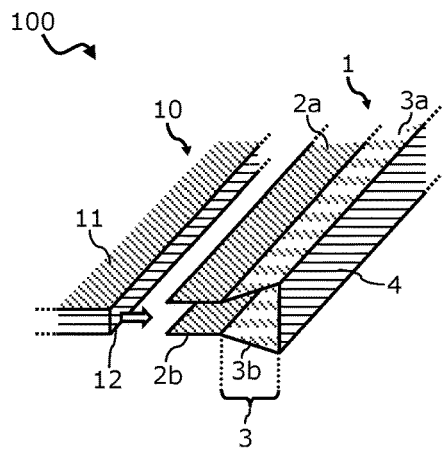
FIG. 1 shows a schematic illustration of a frame profile for a solar cell laminate according to an exemplary embodiment of the invention.

The attached figures shall show another understanding of the embodiments of the invention. They illustrate embodiments and serve in connection with the description of the explanation of the principles and concepts of the invention. Other embodiments and many of the above advantages result in view of the drawings. The elements of the drawings are not necessarily shown to scale. Direction indicating terminology, such as "above", "below", "left", "right", "over", "under", "horizontal", "vertical", "front", "behind" and similar information are used only for the purpose of explanations and not to limit the generality of specific configurations as shown in the figures.

Functionally same and similarly acting elements, features and components in the figures of the drawings are—unless specified otherwise—are provided by the same reference numerals.

DESCRIPTION OF EXEMPLARY EMBODIMENTS

Solar modules within the scope of the present invention include panel-shaped, rigid components, which have one or more semiconductor elements, configured plane and oriented perpendicular to a surface normal of the solar module, such as mono and/or polycrystalline solar cells or thin-coated solar cells. Therefore, the solar modules within the scope of the present invention have a solar cell laminate, which on the front-side has a first protective layer, for example made of safety glass or hardened glass, and on a rear-side has a second protective layer, for example made of a thermoplastic plastic film, such as Polyvinyl fluoride or another Polyester composite film. The solar cells are disposed between the protective layers in the solar cell laminate, which can be additionally embedded in one or more Ethylene vinyl acetate films.

Therefore, the first and second protective layers can be stain-resistant, scratch-proof and weather-proof, for example by a special surface coating. In addition, the first protective layer is substantially transparent to the sunlight. Ethylene vinyl acetate films serve for protecting the solar cells from corrosion, ageing by UV-radiations and ingress of moisture. Moreover, Ethylene vinyl acetate films serve for electrical insulation and thus prevent short-circuiting within the solar cells array, the solar cells of which are, for example, electrically interconnected in series and/or in parallel via tin-plated copper-strips. The second protective layer on its part can be, for example, a laminate made of several components, and protects the rear-side of the solar module from weather conditions and mechanical loading.

FIG. 1 shows a schematic illustration of a frame profile 1 for a solar cell laminate 10 for connection to a solar module 100. The solar cell laminate 10 can have, for example, a rectangular surface area with an active surface 11. The active surface 11 can be formed by a glass disc completing the solar cell laminate 10 at the top and the solar cells underneath converting the light reaching the solar cell laminate 10 into electrical energy. Therefore, the solar cell laminate 10 has a substantially uniform thickness over the entire surface area.

The solar cell laminate 10 can be inserted into the frame profile 1 by one of the side edges 12, for example by a longitudinal edge as schematically indicated by the arrow in FIG. 1. For example, the frame profile 1 can be an extruded section, for example made of Aluminum, or alternatively reshaped in a roll forming or roll profiling process from an Aluminum sheet. If required, the frame profile 1 can also be anodized.

Generally, the frame profile 1 includes a laminate clamping section 2, at which a profile section 3 abuts. The laminate clamping section 2 is formed by two parallel clamping feet 2a and 2b, configured plane and mutually spaced apart, which are disposed such that the solar cell laminate 10 can be received planely and clamped between them. For this purpose, the distance between the clamping feet 2a and 2b substantially corresponds to the thickness of the solar cell laminate 10 to be clamped. The frame profile 1 can be fixed to the solar cell laminate 10, for example, via double-sided adhesive tape or another (liquid) glue, which is applied on the inner side of the clamping feet 2a and 2b.

Therefore, the clamping feet 2a and 2b of the laminate clamping section 2 are disposed on the opening edges of the profile section 3. The profile section 3 has a portion for the solar cell laminate 10 which are formed by a connecting base 4 on the side of the frame profile 1 facing away from the laminate clamping section 2 and by sides 3a and 3b which are disposed on both ends of the connecting base 4. Therefore, the sides 3a and 3b are particularly formed such that the portion has an undercut or an indentation at least partially. In other words, the sides 3a and 3b are configured such that the portion has—at least at one point of the profile section 3—an extension in the direction of the surface normal of the solar cell laminate 10 to be inserted in the portion, the extension is greater than the gap between the clamping feet 2a and 2b of the laminate clamping section 2.

The solar cell laminate 10 is inserted through the laminate clamping section 2 right up to the portion and joined to the frame profile 1 into a framed solar module 100. By the undercut of the portion, the profile section 3 thus forms a tensioned tapping element for the solar module 100, which can represent a tensioned tongue-and-groove joint along with a correspondingly shaped mounting rail for the profile section 3. For example, shapes for such mounting rails are explained further below in connection with the FIGS. 3 and 4.

In addition, sealing compound or adhesive compound, such as Silicon, silane modified polymers or polyurethanes can be introduced in the portion of the profile section 3 for strengthening the connection between the solar cell laminate 10 and the frame profile 1 and for increasing resistance to the weather conditions or ageing-related weakening.

In principle, it is possible to introduce the frame profile moulding 1 at each of the side edges 12 of the solar cell laminate 10. However, it can prove to be particularly advantageous to arrange the frame profile 1 only at two opposed outer edges, preferably the longitudinal edges of a rectangular solar cell laminate 10. Thereby, the solar modules 100 can be slid along the direction of the longitudinal edges in corresponding mounting rails. If these longitudinal edge direction and thereby the orientation of the mounting rails extends along the roof inclination of a sloping roof of a house provided for the assembly of the solar modules 100, snow or rain water can run-off or drain unhindered over the broadsides of the solar modules 100, which extend parallel to the lower roof edge. Thus, the formation of smudges on the unframed broadsides of the solar modules 100 can be advantageously prevented; which in turn facilitates the maintenance and cleaning of the solar modules 100 and increases the efficiency of the solar cells of the solar modules 100.

The laminate clamping section 2 and the profile section 3 can be particularly configured in one-piece and integral with each other, for example, by means of an extrusion, roll forming or roll profiling process. Therefore, in particular, the thickness of the clamping feet 2*a*, 2*b*, sides 3*a*, 3*b* and connecting base 4 can be selected substantially uniform. The frame profile 1 can have a uniform cross-section over the entire top planking.

Figure 2:
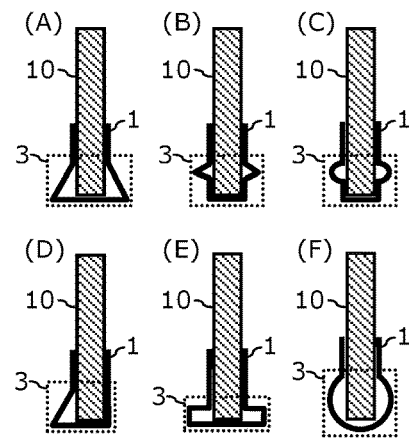
FIG. 2 shows schematic illustrations of exemplary cross-sectional profiles of the frame profile in FIG. 1 according to further exemplary embodiments of the invention.
Figure 3:
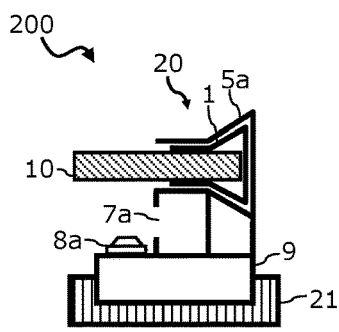
FIG. 3 shows a schematic illustration of exemplary detail of a fastening system for solar modules according to another exemplary embodiment of the invention.
Figure 4:
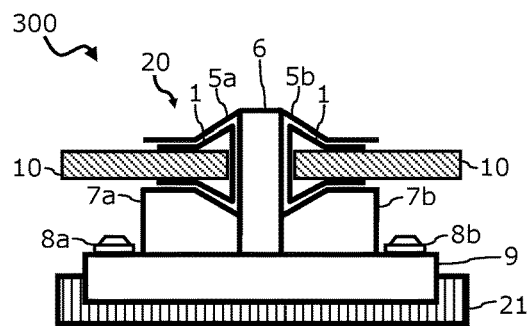
FIG. 4 shows a schematic illustration of exemplary detail of another fastening system for solar modules according to another exemplary embodiment of the invention.

In FIG. 2(A) to (F) are shown exemplary schematic illustrations of exemplary cross-sections of the solar module 100. Therefore, the solar cell laminate 10 is respectively inserted in a frame profile 1. Therefore, the frame profile 1 represented in FIGS. 2(A) to 2(F) has respective differently formed profile sections 3. Therefore, the exemplary embodiments shown in FIG. 2(A) to (F), show respective profile sections 3, which include an undercut at least partially. Therefore, it should be obvious that the features and groups of features of the exemplary embodiments explained in one of the FIG. 2(A) to (F) can also be applicable to other exemplary embodiments. In particular, the embodiments for the profile sections 3 explained in FIG. 2(A) to (F) can equally be employed for solar modules 100 as represented in FIG. 1 as well as in the fastening systems as represented in FIGS. 3 and 4.

In FIG. 2(A), the profile section 3 has a trapezoidal cross-section ("dovetail"), i.e. the connecting base 4 has a larger width than the thickness of the solar cell laminate 10 and the sides 3*a* and 3*b* extend inclined and converging from the connecting base 4 towards the opening edges of the profile section 3. Thus, the cross-section resulting therefrom resembles a trapezoid.

In the FIGS. 2(B) and 2(C), the profile section 3 basically has a rectangular cross-section, however, respective convex protrusions, i.e. oriented outwards are configured in the sides 3*a* and 3*b*. For example, saw-teeth like protrusions are shown in FIG. 2(B), while rounded bumps are represented in FIG. 2(C), In both cases, the protrusion side surfaces facing the laminate clamping section 2 of the frame profile 1 form undercuts, which can be brought in form-fit engagement with the corresponding recesses of a mounting rail. However, it is therefore clear that other geometrical profile cross-sections can also be suitable for the projections and can be adapted according to the need and the manufacturing process.

In FIG. 2(D), the profile section 3 has a chamfered projection only on one side of the solar cell laminate 10, i.e. the profile section 3 depicts a "half" trapezium. By the configuration of a projection only on one side of the frame profile 1, the frame profile 1 can be kept overall narrower and the installation height of the solar modules 100 can advantageously be made lower. Generally, the provision of undercuts only on one side of the frame profile 1 can also be provided in the other embodiment variants of the FIGS. 2(A), (B), (C), (E) and (F) basically by maintaining the geometric profile shapes represented there.

In FIG. 2(E), the profile section 3 has a T-shape, i.e. rectangular projections are disposed on the connecting base 4, which form an undercut. In FIG. 2(F), the profile section 3 is overall configured as a truncated hollow cylinder on the opening side, so that connecting base 4 and sides 3*a*, 3*b* merge seamlessly. Sharp edges can be avoided at the undercuts by the round or elliptical hollow profile, by which, for example, the risk by damages to the sensitive solar cell laminates 10 by inadvertent contact with the frame profile of adjacently stored or transported solar modules 100 can be reduced during the transport of the solar modules 100.

Generally, in the selection of the geometric shape of the profile sections 3 according to one of the variants of the FIG. 2(A) to (F) or a modified shape thereof, for example the manufacturing tolerance in the production process of the frame profile and the mounting rails corresponding thereto can be considered for ensuring a best possible matching portion of the solar modules 100 in the support system or fastening system, without the need to accept any undesirable play during the assembly.

FIGS. 3 to 6 show respective details of fastening systems 200, 300, 400 and 500 for solar modules, such as the solar modules 100 as illustrated and explained in connection with the FIGS. 1 and 2. The fastening systems 200, 300, 400 and 500 of FIGS. 3 to 6 generally include one or more solar modules 100, which have one solar cell laminate 10 with at least one frame profile 1 on one side edge. Therefore, the one or more solar modules 100 are brought into form-fit engagement with the mounting rails 5*a* or 5*b* corresponding to the cross-sectional profiles of the frame profile 1. Therefore, the mounting rails 5*a* or 5*b* are each part of a support rail 20 of the respective fastening systems 200, 300, 400 and 500, of which the fastening systems 200, 300, 400 and 500 can respectively have more.

The support rails 20 are generally formed in longitudinal shape and same in their cross-section over the longitudinal extension. In particular, the support rails 20 have a longitudinal extension, which goes beyond the length of a longitudinal edge 12 of a solar module 10 framed with a frame profile 1. For example, the support rails 20 can have an at least n-times the length (n>1) of a longitudinal edge 12 of a solar module 100, so that several solar modules 100 are successively inserted and captured in a form-fitly locked manner with their respective frame profile 1 in the mounting rails 5*a* or 5*b* of the support rails 20.

For example, the support rails 20 of FIGS. 3 to 6 can be made of Aluminum, for example in an extrusion process, roll forming or roll profiling process. If necessary, the support rails 20 are anodized as a whole to achieve an improved resistance to weather.

While the support rails 20 extend along the framed longitudinal edges 12 of the solar modules 100 or along the direction of extension of the frame profile 1, the fastening systems 200, 300, 400 and 500 also include cross-beams 21 extending across the support rails 20, on which the support rails 20 can be fixed. Therefore, the cross-beams 21 can be used for fastening the entire support system made of solar modules 100 and support rails 20 on a desired supporting surface, such as a rooftop or the floor. The support rails 20 can be connected to the cross-beams 21 via any suitable means, such as plug connections, latching connections, screw connections, or bonded joints.

In the exemplary variants of FIGS. 3 to 6, respective trapezoidal profiles for the profile sections 3 of the frame profile 1 are represented as illustrative examples. However, it is obvious that irregularly formed profile sections 3 can also be considered for forming the frame profile 1 of the solar modules 100 used in the fastening systems 200, 300, 400, 500, particularly the shapes of the profile sections 3 as illustrated and explained in connection with FIG. 2(A) to (F). According to selection of the shape of the profile sections 3, then it is also obvious that the mounting rails 5a or 5b can also be configured in the shape of the selected profile sections 3 of corresponding hollow profile form to constantly ensure a form-fit engagement of the frame profile 1 with the mounting rails 5a or 5b.

The solar modules 100—with their framed longitudinal edges 12—can be brought in engagement with the mounting rails 5a or 5b by insertion along the frame profile 1. In this manner, several solar modules 100 can be sequentially inserted into the mounting rails 5a or 5b, in longer support rails 20. After insertion into the mounting rails 5a or 5b, the solar modules 100 should not necessarily be additionally secured or fixed in the mounting rails 5a or 5b. For the maintenance, repair or dismantling of the fastening system 200, 300, 400 or 500, it could then be very easy to pull the individual solar modules 100 again in reversed sequence, out of the mounting rails, without the need of any special tools therefor.

If necessary, in the support rails 20, not extending horizontally, i.e. inclined support rails, one or more rail end caps can be provided, which secure the solar modules 100 against a longitudinal shifting in the mounting rails 5a or 5b. These rail end caps can be connected to the mounting rails 5a or 5b after form-fit engagement of the solar modules 100.

FIG. 9 shows a schematic illustration of an exemplary rail end cap 22, as it can be employed for the fastening systems 200, 300, 400, 500 and 600 of FIGS. 3 to 6 and 8. For example, the rail end cap 22 can be made of plastic and can be adapted in its outer shape to the hollow profile of the mounting rails 5a or 5b of the support rails 20, so that the rail end cap 22 can be inserted into the border of a mounting rail 5a or 5b. Therefore, the rail end cap 22 can be clamped, for example, force-fitted in the hollow profile of the mounting rails 5a or 5b. Alternatively or in addition to this, the rail end cap 22 can have hole 23 or through hole, by which the rail end cap 22 can be fixed in the mounting rail 5a or 5b by a rivet, bolt or screw. Therefore, the rail end cap 22 can be attached to the mounting rail 5a or 5b after inserting the framed longitudinal edges 12 of one or more solar modules 100, in order to prevent the solar modules 100 from slipping out of the mounting rail 5a or 5b. This is particularly advantageous during the assembly of the fastening system 200, 300, 400, 500 or 600 on a sloping roof.

The embodiment variant of the fastening system 200 in FIG. 3 is characterized by that only single-sided mounting rail is possible for receiving one or more solar modules 100 on the left side of the support rail 20 in the drawing. For example, such support rail 20 can be employed on the borders to a solar module array. The support rail 20 can have, for example, a cabling duct under the mounting rail 5a, in which electrical supply lines can be routed to the solar cells of the solar cell laminate 10 along the support rails 20. The support rail 20 can also have a fastening section 9, which can be connected to the cross-beam 21, for example by screw or bolt connections 8a. Therefore, the mounting rail 5a, the cabling duct 7a as well as the fastening section 9 can be particularly configured in integrally.

The embodiment variant of the fastening system 300 in FIG. 4 is distinguished from the fastening system 200 of the FIG. 3 by that mounting rails 5a or 5b are moulded on both sides of the support rail 20, so that one or more solar modules 100 can be received form-fitly locked in the respective mounting rails 5a or 5b on the left as well as on the right of the support rail 20. Therefore, the hollow profiles of the mounting rails 5a or 5b have openings, which point in opposite directions. Accordingly, the support rails 20 of the FIG. 4 can also have two cabling ducts 7a and 7b. A spacer section 6 can be added between the mounting rails 5a or 5b for flexible gaps of the individual solar module rows on both sides of the support rail 20. This spacer section 6 can also advantageously increase the mechanical stability of the hollow profiles of the mounting rails 5a or 5b from bending or snapping-off. By the broadened fastening section 9 of the FIG. 4 as against the narrower embodiment variant of the FIG. 3, another screw or bolt connection 8b can also be provided, by which the fastening section 9 can be fixed to the cross-beam 21.

Figure 5:
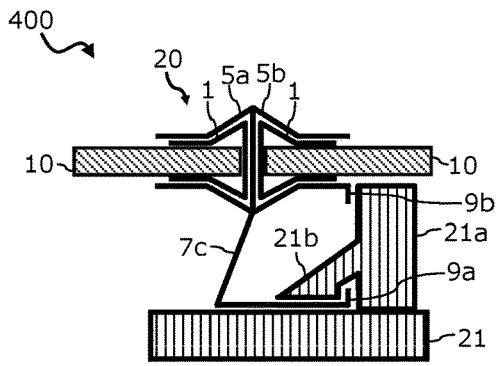
FIG. 5 shows a schematic illustration of exemplary detail of another fastening system for solar modules according to another exemplary embodiment of the invention.

In FIG. 5, an embodiment variant of a fastening system 400 is shown, in which the mounting rails 5a or 5b are moulded without lateral gap from each other. Only a support leg 7c is attached to the mounting rails 5a or 5b, which enables a hooking of the support rail 20 on a locking hook 21a of a cross-beam 21 via locking tabs 9a and 9b. The locking hook section 21a can be brought out of the cross-beam 21 from the cross-beam level above a locking projection 21b. By this type of connection of the support rail 20 with the cross-beam 21, if required, screw or bolt connections can be dispensed with, whereby the assembly expenditure reduces.

Figure 6:
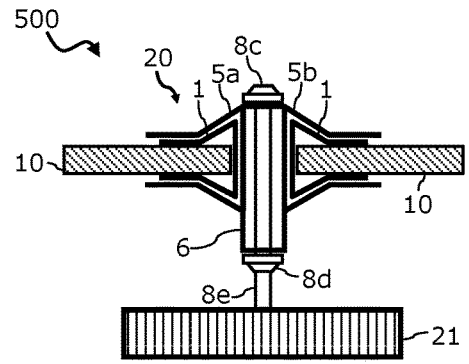
FIG. 6 shows a schematic illustration of exemplary detail of another fastening system for solar modules according to another exemplary embodiment of the invention.

The embodiment variant of the fastening system 500 in FIG. 6 is characterized by that the spacer section 6 between the mounting rails 5a and 5b also serves as guide channel for a screw or bolt 8e, which can be fixed in the support rail 20 via nuts and locking nuts 8c or 8d. The screw or bolt 8e on their part can then serve for connecting the support rail with a hole in a cross-beam 21 located below it. Such screws or bolts 8e can be provided at regular gaps along the support rail 20 to enable a connection with several mutually parallel extending and mutually spaced apart cross-beams 21.

FIG. 7 shows another exemplary embodiment of a framed solar module 100, which can be formed by assembling a solar cell laminate 10 with a frame profile 1. In contrast to the frame profile 1, as it is represented and explained in FIG. 1, the frame profile 1 of the FIG. 7 additionally has a flange 4a on the connecting base 4 moulded perpendicular to the connecting base 4. For example, the flange 4a can have one or more through holes 4b at regular gaps along the direction of extension of the frame profile 1. The flange 4a can be moulded substantially in the middle of the connecting base 4, however, wherein it may also be advantageous to provide a predefined degree of eccentricity for moulding the flange 4a.

This eccentricity can serve to enable superimposing two opposing flanges 4a and the frame profile 1 disposed at the same height in the joint area. Such superimposition of two flanges 4a is represented in the embodiment variant of a fastening system 600 in FIG. 8. The embodiment variant of the fastening system 600 in FIG. 8 substantially corresponds to the embodiment variant of the fastening system 500 in FIG. 6 and is essentially distinguished from the latter in that perforations are introduced in the perpendicular inner walls of the mounting rails 5a or 5b, through which the flange 4a of adjoining frame profile 1 of the left and right rail side can protrude into the spacer section 6. Therefore, the spacer section 6 is dimensioned such that the flanges 4a can be received completely from both the sides in the spacer section 6 and therefore, superimpose in the joint area.

By the through holes 4b of the superimposing flanges 4a to be superimposed accordingly, the screws or bolts 8e can then be guided through and the frame profile 1 can additionally be prevented from shifting or undesired movement within the mounting rails 5a or 5b. The fastening system 600 in FIG. 8 can particularly be employed for solar module applications with high demands on ruggedness and safety of installation, in which aesthetic plays a secondary role, such as industrial plants or open-site photovoltaic plants.

FIG. 10 shows a block diagram of a process 30 for framing a solar cell laminate. The process 30 can be used, particularly for framing the solar cell laminate 10 with a frame profile 1 as represented in FIG. 1 or 2(A) to (F). By the process 30, particularly a framed solar module 100 can be manufactured.

In a first step 31, a panel-shaped solar cell laminate 10 is inserted into a laminate clamping section 2 of a frame profile 1 with two parallel clamping feet 2a, 2b configured plane and mutually spaced apart. Then in step 32, the panel-shaped solar cell laminate 10 is pushed through the laminate clamping section 2 into the profile section 3 adjoining the laminate clamping section 2. The profile section 3 has a portion formed by sides 3a, 3b. The sides 3a, 3b are formed such that the portion has an undercut at least partially.

Finally, the solar cell laminate 10 can be fixed between the clamping feet 2a, 2b, for example, by means of a double-sided adhesive tape. Optionally, in a step 34, more sealant or adhesive compound such as Silicon or the like can be injected into the portion, so that the panel-shaped solar cell laminate 10 can be fixed into the profile section 3.

FIG. 11 shows a block diagram of a process 40 for fastening a framed solar module to a support rail, for example a support rail 20, as represented and explained in connection with FIG. 3 to 6 or 8.

In a first step 41, the frame profile 1 of the solar module 100 is inserted into a mounting rail 5a or 5b of the support rail 20, so that the frame profile 1 of the solar module 100 is in a form-fit engagement with the mounting rail 5a, 5b. Thereafter, a rail end cap, for example a rail end cap 22, as explained in connection with FIG. 9, is attached at the open end of the mounting rail 5a, 5b of the support rail 20, so that the solar module 100 is arrested in the mounting rail 5a, 5b by rail end cap.

In the previously detailed description, different features have been summarized for improving the conclusiveness of the representation in one or more examples. However, it should be understood that the above description is merely illustrative, but not limiting under any circumstances. It helps in covering all alternatives, modifications and equivalents of the different features and exemplary embodiments. Many other examples are directly and immediately clear to the skilled person because of his/her professional knowledge in view of the above description.

The exemplary embodiments were selected and described in order to be able to best represent the principles and their possible practical application underlying the invention. Thereby, the experts can optimally modify and use the invention and its different exemplary embodiments with reference to the intended use. In the claims and the description, the terms "containing" and "having" are used as linguistically neutral terminologies for the corresponding terms "comprising". Furthermore, the use of the term "one" shall not exclude the plurality of such features and components described.

LIST OF THE REFERENCE NUMERALS

1 Frame profile
2 Laminate clamping section
2a Clamping feet
2b Clamping feet
3 Profile section
3a Groove side
3b Groove side
4 Connecting base
4a Flange
4b Through hole
5a Mounting rail
5b Mounting rail
6 Spacer section
7a Cabling duct
7b Cabling duct
7c Support leg
8a Screw/Bolt connection
8b Screw/Bolt connection
8c Nut
8d Locking nut
8e Screw/Bolt
9 Fastening section
9a Locking tab
9b Locking tab
10 Solar cell laminate
11 Solar cell array
12 Side edge
20 Support rail
21 Cross-beam
21a Locking hook
21b Locking projection
22 Rail end cap
23 Hole
30 Process step
31 Process step
32 Process step
33 Process step
34 Process step
40 Process
41 Process step
42 Process step
100 Solar module
200 Fastening system
300 Fastening system
400 Fastening system
500 Fastening system
600 Fastening system

The invention claimed is:

1. A solar module comprising:
a flange;
a solar cell laminate; and
a frame profile,
wherein the frame profile includes:
a laminate clamping section, which comprises two parallel clamping feet configured plane and mutually spaced apart for holding the solar cell laminate; and
a profile section adjoining the laminate clamping section, which includes a portion formed by sides for receiving the solar cell laminate and has a connecting base on the frame profile, at least partially, wherein at least one of the sides is formed such that the portion has an undercut at least partially, and the profile section comprises a trapezoidal cross-section at least partially, the trapezoidal cross-section being configured for the clamping feet to hold the solar cell laminate in a form-fit fashion,
the flange is moulded on the connecting base at least partially and is substantially perpendicular to the connecting base, and the flange is located between the two clamping feet in a cross sectional view,
the flange comprises a plurality of through holes arranged along a direction of extension of the frame profile that is perpendicular to a direction in which the solar cell laminate is inserted into the frame profile and perpendicular to a direction in which the clamping feet oppose each other, and
the flange and the portion sandwich the connecting base therebetween.

2. The solar module according to claim 1, wherein projections are configured on the connecting base.

3. The solar module according to claim 1, wherein the profile section is overall configured as a truncated hollow cylinder on an opening side.

4. A plural-sided framed solar module comprising:
the solar module according to claim 1, wherein the solar cell laminate is a panel-shaped solar cell laminate and the frame profile is a first frame profile; and
a second frame profile;
wherein the solar cell laminate is inserted between the clamping feet of the laminate clamping section right up to the portion of the first frame profile and is connected to the second frame profile.

5. A fastening system for solar modules comprising:
a solar module according to claim 1; and
a support rail, which comprises at least one mounting rail, which is in form-fit engagement with the frame profile of the solar module.

6. The fastening system according to claim 5, wherein the support rail comprises at least two mounting rails with hollow profiles, which include openings, which guide in opposite directions of the support rail.

7. The fastening system according to claim 6, wherein the support rail further comprises a spacer section, which is disposed between the at least two mounting rails.

8. The fastening system according to claim 7, furthermore having screw or bolt connection, which extends through the spacer section.

9. The fastening system according to claim 8, wherein the flange is molded on the connecting base of the frame profile, substantially perpendicular to the connecting base, the frame profile protrudes into the spacer section, and the screw or bolt connection extends through one of the through holes in the flange.

10. A solar module with a solar cell laminate and a first and a second frame profile each located at opposite edges of the solar cell laminate, the frame profiles each comprising:
a laminate clamping section, which comprises two parallel clamping feet configured plane and mutually spaced apart for holding the solar cell laminate;
a profile section adjoining the laminate clamping section, which includes a portion formed by sides for receiving the solar cell laminate and has a connecting base on the frame profile, at least partially, and
a flange, which is moulded on the connecting base at least partially and is substantially perpendicular to the connecting base, wherein the flange is located between the two clamping feet in a cross sectional view,
wherein the flange comprises a plurality of through holes arranged along a direction of extension of one frame profile that is perpendicular to a direction in which the corresponding solar cell laminate is inserted into the frame profile and perpendicular to a direction in which the clamping feet oppose each other.

11. The solar module according to claim 10,
wherein the flange is off a center of a distance between the two clamping feet in the cross sectional view.

12. The solar module according to claim 10,
wherein at least one of the sides for receiving the solar cell laminate is formed such that the portion has an undercut at least partially.

13. The solar module according to claim 10,
wherein projections are configured on the connecting base.

14. The solar module according to claim 10,
wherein the profile is overall configured as a truncated hollow cylinder on an opening side.

* * * * *